(12) United States Patent
Pandey et al.

(10) Patent No.: US 9,391,206 B2
(45) Date of Patent: Jul. 12, 2016

(54) METHODS OF FORMING TRANSISTORS

(71) Applicant: Micron Technology, Inc., Boise, ID (US)

(72) Inventors: Deepak Chandra Pandey, Boise, ID (US); Haitao Liu, Boise, ID (US); Fawad Ahmed, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/992,966

(22) Filed: Jan. 11, 2016

(65) Prior Publication Data

US 2016/0126354 A1 May 5, 2016

Related U.S. Application Data

(63) Continuation of application No. 14/836,257, filed on Aug. 26, 2015, now Pat. No. 9,263,341, which is a continuation of application No. 14/189,296, filed on Feb. 25, 2014, now Pat. No. 9,147,729.

(51) Int. Cl.
| | |
|---|---|
| *H01L 21/00* | (2006.01) |
| *H01L 29/78* | (2006.01) |
| *H01L 27/088* | (2006.01) |
| *H01L 29/423* | (2006.01) |
| *H01L 29/06* | (2006.01) |

(52) U.S. Cl.
CPC ........ *H01L 29/7853* (2013.01); *H01L 27/0886* (2013.01); *H01L 29/0607* (2013.01); *H01L 29/42356* (2013.01)

(58) Field of Classification Search
CPC ............ H01L 29/7853; H01L 27/0886; H01L 29/42356; H01L 29/0607
See application file for complete search history.

(56) References Cited

U.S. PATENT DOCUMENTS

| | | | |
|---|---|---|---|
| 5,180,680 A | 1/1993 | Yang | |
| 5,281,548 A | 1/1994 | Prall | |
| 5,460,989 A * | 10/1995 | Wake | ................ H01L 27/11517 257/E21.68 |
| 2015/0243734 A1 | 8/2015 | Pandey | |

* cited by examiner

*Primary Examiner* — Richard Booth
(74) *Attorney, Agent, or Firm* — Wells St. John P.S.

(57) ABSTRACT

Some embodiments include methods of forming transistors. Recesses are formed to extend into semiconductor material. The recesses have upper regions lined with liner material and have segments of semiconductor material exposed along lower regions. Semiconductor material is isotropically etched through the exposed segments which transforms the recesses into openings having wide lower regions beneath narrow upper regions. Gate dielectric material is formed along sidewalls of the openings. Gate material is formed within the openings and over regions of the semiconductor material between the openings. Insulative material is formed down the center of each opening and entirely through the gate material. A segment of gate material extends from one of the openings to the other, and wraps around a pillar of the semiconductor material between the openings. The segment is a gate of a transistor. Source/drain regions are formed on opposing sides of the gate.

16 Claims, 14 Drawing Sheets

METHODS OF FORMING TRANSISTORS

RELATED PATENT DATA

This patent resulted from a continuation of U.S. patent application Ser. No. 14/836,257, which was filed Aug. 26, 2015, and which is hereby incorporated herein by reference; which is a continuation of U.S. patent application Ser. No. 14/189,296, which was filed Feb. 25, 2014, which issued as U.S. Pat. No. 9,147,729, and which is hereby incorporated herein by reference.

TECHNICAL FIELD

Methods of forming transistors.

BACKGROUND

Transistors are commonly utilized in integrated circuits, and may have many applications throughout memory, logic, etc. For instance, transistors may be utilized in dynamic random access memory (DRAM) arrays, NAND flash, etc.

A continuing goal of integrated circuit fabrication is to create higher levels of integration, and accordingly to reduce size and spacing of existing components. It is becoming increasingly difficult to reduce the size of transistors due to short channel effects and other complications.

Transistor performance may be characterized by numerous metrics, including, for example, current flow through the on state ($I_{on}$) of the transistor and current flow through the off state ($I_{off}$) of the transistor. It is desired to have high $I_{on}$ without leakage so that current is controlled and relatively unimpeded when the transistor is in the on state; and it is desired to have low $I_{off}$. Often there may be some level of leakage through transistors, especially as the transistors become increasingly smaller. An example leakage mechanism is hot electron induced punchthrough (HEIP), which can be particularly problematic in transistors having short channels.

DETAILED DESCRIPTION OF THE ILLUSTRATED EMBODIMENTS

Some embodiments include new methods of forming transistors. Example transistors that may be formed with such methods are described with reference to FIGS. 1 and 2.

Figure 1:
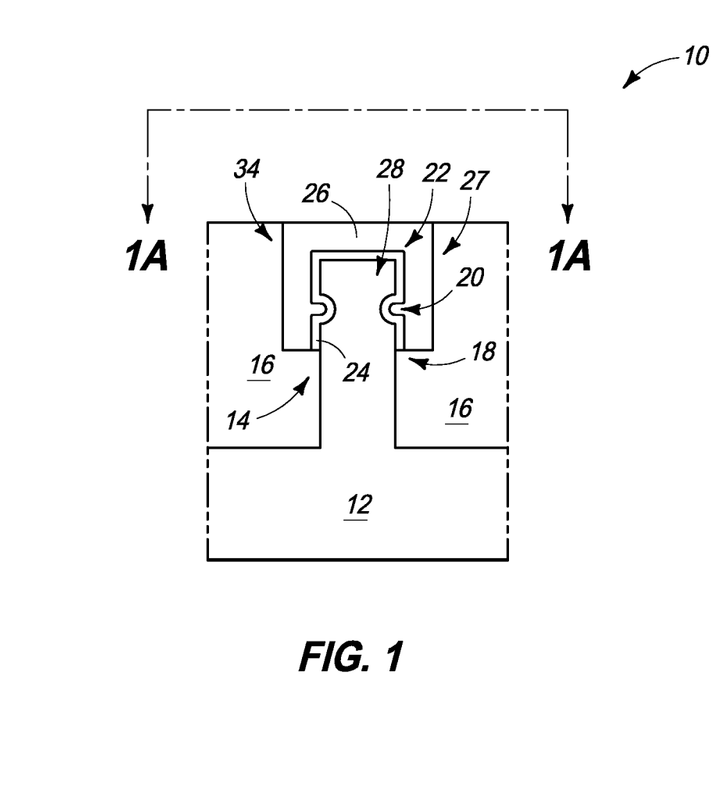
FIGS. 1 and 1A are a cross-sectional side view and a top view, respectively, of a construction comprising an example embodiment transistor. The view of FIG. 1 is along the line 1-1 of FIG. 1A, and the view of FIG. 1A is along the line 1A-1A of FIG. 1.
Figure 1A:
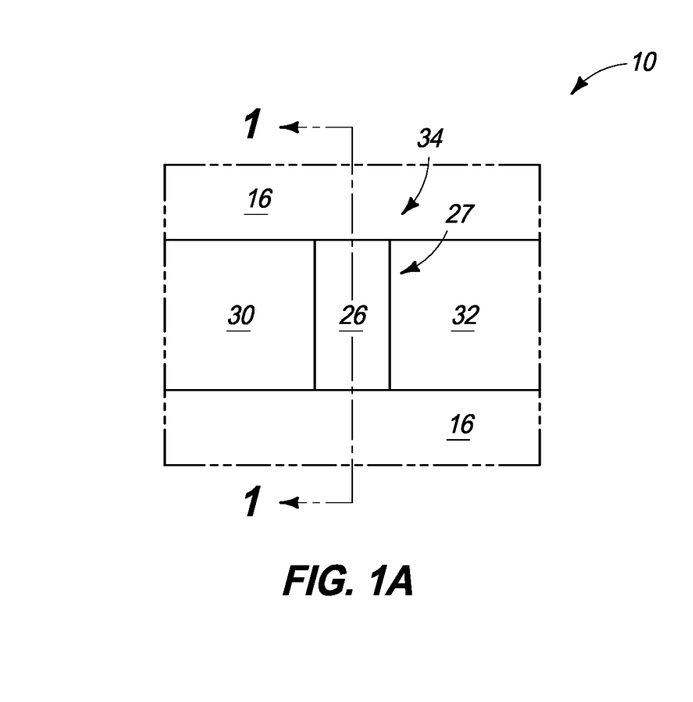

Referring to FIGS. 1 and 1A, a construction 10 is shown in cross-sectional side view (FIG. 1) and top view (FIG. 1A). The construction includes a pillar 14 of semiconductor material 12.

Semiconductor material 12 may comprise any suitable composition including, for example, silicon, germanium, silicon/carbon, silicon/germanium, etc. In some embodiments, the semiconductor material 12 may comprise, consist essentially of, or consist of monocrystalline silicon. The semiconductor material 12 may be considered to be part of a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, material 12 may be part of a semiconductor substrate containing one or more materials associated with integrated circuit fabrication. Some of the materials may be under the shown region of material 12 and/or may be laterally adjacent the shown region of material 12; and may correspond to, for example, one or more of refractory metal materials, barrier materials, diffusion materials, insulator materials, etc.

Electrically insulative material 16 is along sidewalls of pillar 14. The electrically insulative material may comprise any suitable composition or combination of compositions. In some embodiments, material 16 may comprise one or both of silicon dioxide and silicon nitride. For instance, material 16 may comprise primarily silicon nitride, but may additionally comprise a thin layer of silicon dioxide between the silicon nitride and surfaces of semiconductor material 12.

The pillar 14 comprises a first wide region 18, a narrow region 20, and a second wide region 22. In some embodiments, narrow region 20 may be referred to as a waist region. Gate dielectric material 24 extends along an upper portion of the pillar 14; and specifically extends along an upper part of the first wide region 18 and along an entirety of the narrow region 20 and second wide region 22.

The gate dielectric material may comprise any suitable composition or combination of compositions; and in some embodiments may comprise, consist essentially of, or consist of silicon dioxide.

Electrically conductive gate material 26 extends along the upper portion of pillar 14, and is spaced from the semiconductor material 12 by gate dielectric material 24. The electrically conductive gate material may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

The gate material 26 and gate dielectric material 24 surround a channel region 28 of a transistor 34. The top view of FIG. 1A shows source/drain regions 30 and 32 formed within semiconductor material on opposing sides of a gate 27 comprising gate material 26. In operation, source/drain regions 30 and 32 are gatedly connected to one another through gate 27; and specifically are gatedly connected through electrical flow along channel region 28.

The gate 27 may extend to any suitable depth relative to pillar 14, and in some embodiments a bottom of the gate may be less than or equal to about 0.4 microns deep. Junction regions are present where the source/drain regions 30 and 32 interface with semiconductor material 12 (such junction regions are not visible in the views of FIGS. 1 and 1A). In some embodiments, the junction regions may be within about 0.2 micron of the bottom of gate 27 (i.e., the depths of the junction regions may be within a range of from the depth of the bottom of the gate plus about 0.2 microns to the depth of the bottom of the gate minus about 0.2 microns).

Transistor 34 may be utilized in any of numerous applications; and may, for example, be incorporated into logic circuitry and/or memory circuitry. In some example applications, transistor 34 may be utilized in DRAM circuitry by connecting one of the source/drain regions 30 and 32 to a charge-storage device (for instance, a capacitor) and the other to a bitline. Accordingly, the transistor 34 may be incorporated into a DRAM unit cell. Such unit cell may be one of a large plurality of substantially identical unit cells utilized in a DRAM array.

Another example transistor construction is described with reference to a construction 10a in FIGS. 2 and 2A. Similar numbering will be utilized in describing FIGS. 2 and 2A as is used above in describing FIGS. 1 and 1A where appropriate.

Construction 10a includes a pillar 14 of semiconductor material 12, and comprises electrically insulative material 16 along sidewalls of pillar 14.

Figure 2:
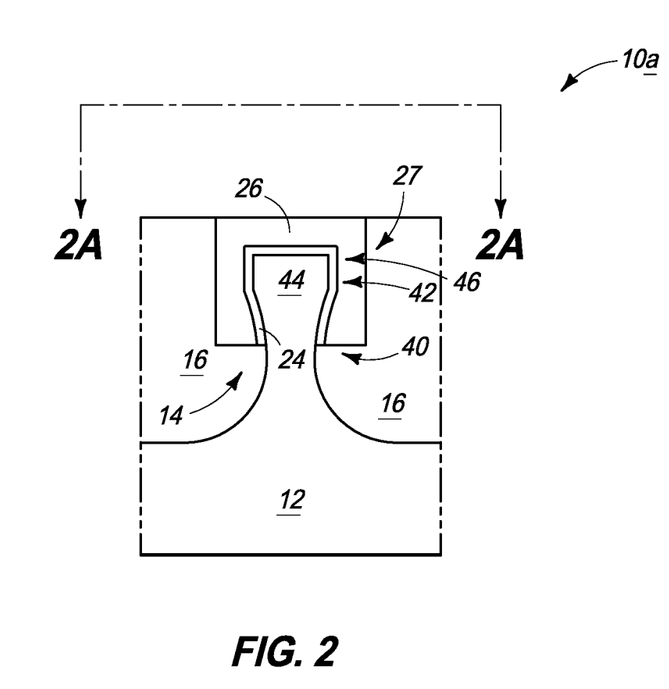
FIGS. 2 and 2A are a cross-sectional side view and a top view, respectively, of a construction comprising another example embodiment transistor. The view of FIG. 2 is along the line 2-2 of FIG. 2A, and the view of FIG. 2A is along the line 2A-2A of FIG. 2.
Figure 2A:
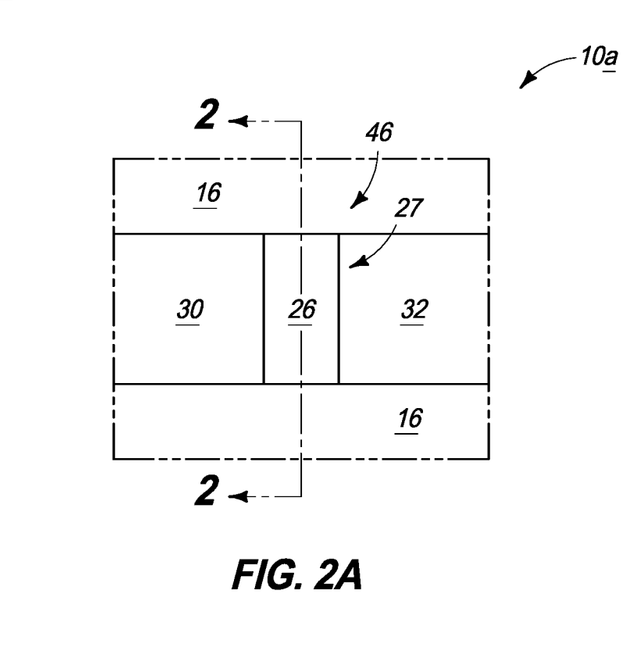

The pillar 14 of FIGS. 2 and 2A comprises a narrow stem 40 joining to a wide cap 42. In some embodiments, narrow stem 40 may be referred to as a waist region, and cap 42 may be referred to as a wide region. Gate dielectric material 24 extends along an upper portion of the pillar 14; and specifically extends along a portion of the narrow stem 40 and along an entirety of the wide cap 42.

Electrically conductive gate material 26 extends along the upper portion of pillar 14, and is spaced from the semiconductor material 12 by gate dielectric material 24.

The gate material 26 and gate dielectric material 24 surround a channel region 44 of a transistor 46. The transistor includes source/drain regions 30 and 32 formed within semiconductor material on opposing sides of a gate 27 comprising gate material 26.

The transistors 34 and 46 of FIGS. 1 and 2 may advantageously consume less die area than conventional transistors for given performance due to increasing effective width, while also providing immunity towards hot electron induced punchthrough (HEIP) degradation and other punchthrough leakage mechanisms, thereby providing improved performance and reliability as compared to conventional transistors.

Figure 3:
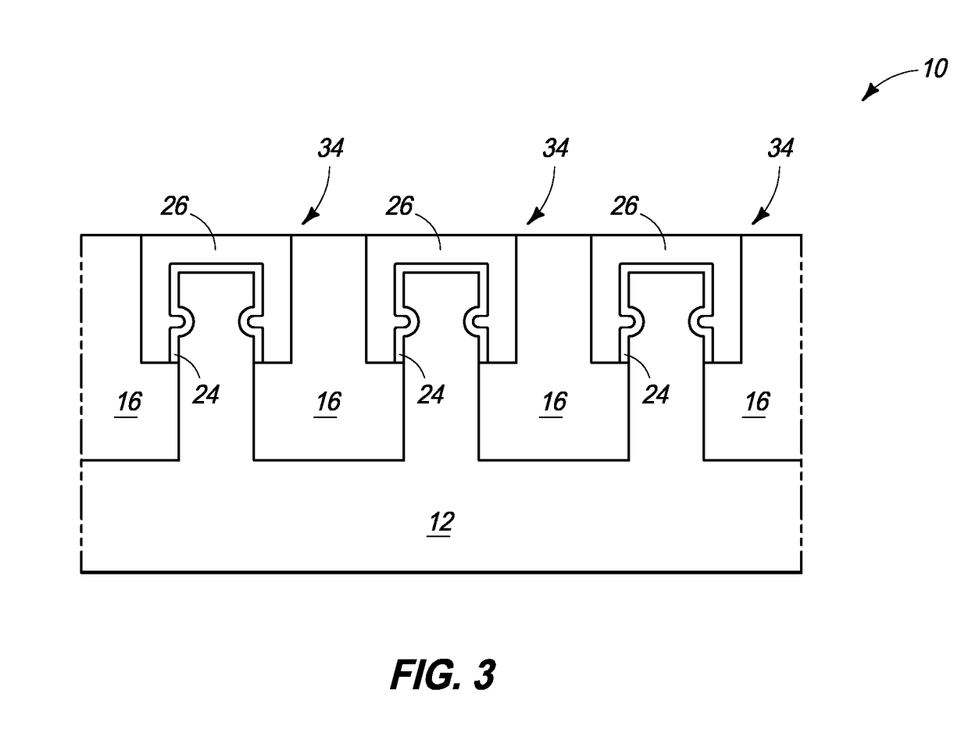
FIG. 3 is a cross-sectional side view of a construction comprising a plurality of transistors of the type shown in FIGS. 1 and 1A.
Figure 4:
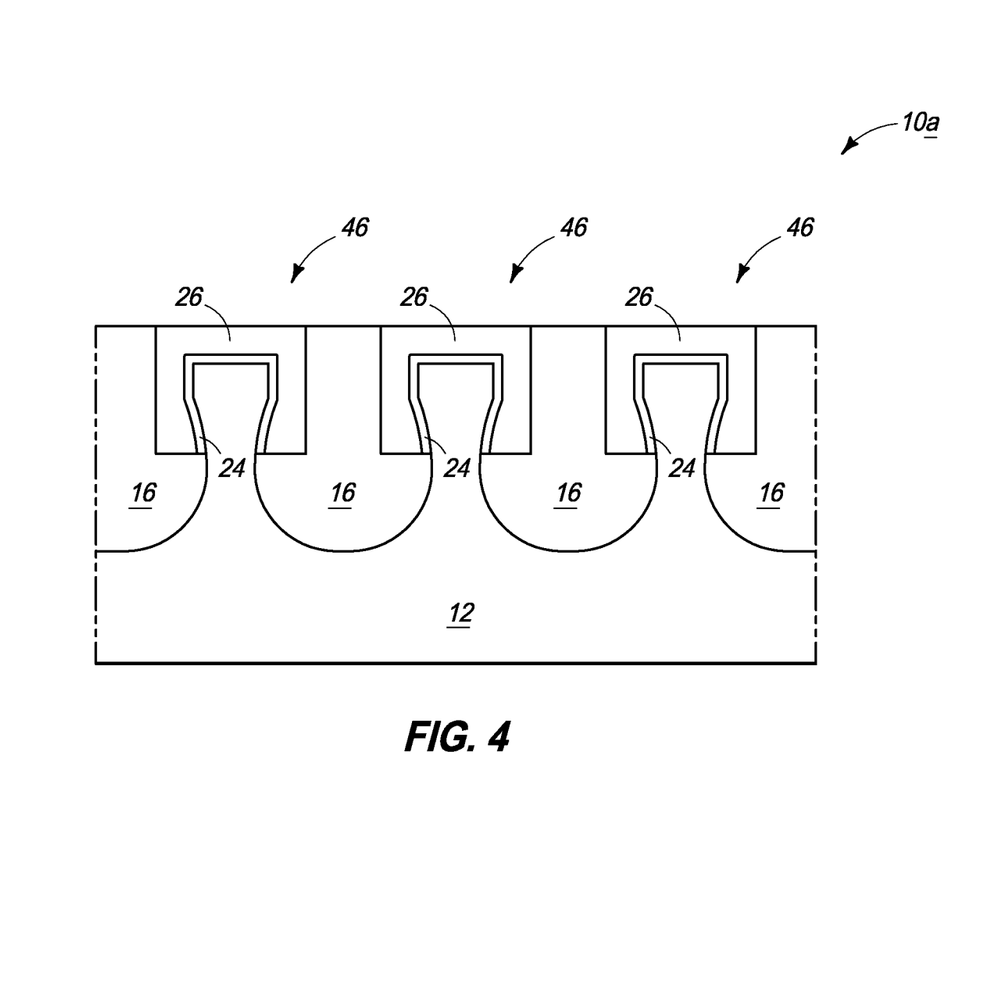
FIG. 4 is a cross-sectional side view of a construction comprising a plurality of transistors of the type shown in FIGS. 2 and 2A.

The transistors 34 and 46 of FIGS. 1 and 2 may be incorporated into memory arrays. FIGS. 3 and 4 illustrate regions of constructions 10 and 10, respectively; comprising pluralities of transistors such as may be utilized in memory arrays.

Some embodiments pertain to methods of forming transistors of the types illustrated in FIGS. 1 and 2. Example methods are described with reference to FIGS. 5-20; with FIGS. 5-12 pertaining to an example method of forming transistors of the type described in FIGS. 1 and 3, and with FIGS. 13-20 pertaining to an example method of forming transistors of the type described in FIGS. 2 and 4.

Figure 5:
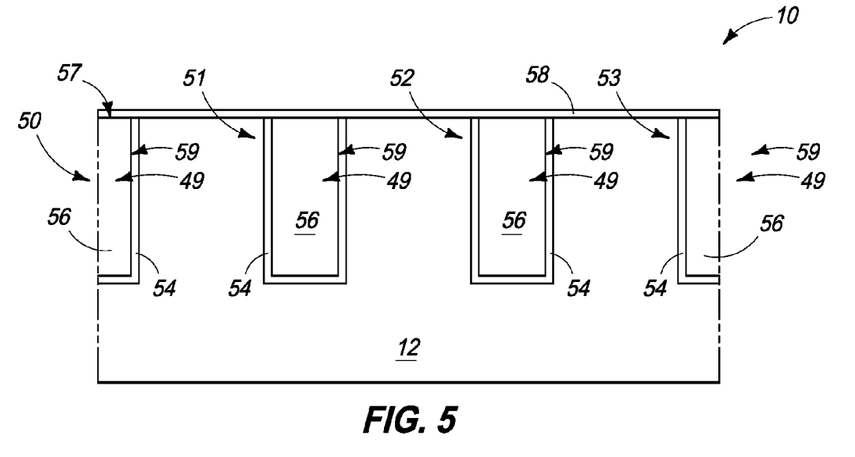
FIGS. 5-12 are diagrammatic cross-sectional views of various process stages of an example embodiment method of forming a plurality of transistors.

Referring to FIG. 5, construction 10 comprises semiconductor material 12, and comprises a plurality of electrically insulative regions 50-53 extending into material 12. The insulative regions 50-53 may be formed by initially forming cavities 49 extending into material 12, and then filling the cavities with one or more insulative compositions. For instance, in the shown embodiment the cavities are lined with a first insulative composition 54, and then filled with a second insulative composition 56. In some embodiments, the first insulative composition may comprise silicon dioxide, and the second insulative composition may comprise silicon nitride. The material within cavities 49 may be referred to as first insulative material 59; and accordingly in the shown embodiment such first insulative material comprises the two different compositions 54 and 56. In other embodiments the first insulative material may comprise a single homogeneous composition, and in yet other embodiments the first insulative material may comprise more than two separate compositions.

A planarized surface 57 extends across the first insulative 59 and semiconductor material 12. Such surface may be formed utilizing any suitable processing, including, for example, chemical-mechanical polishing (CMP).

A protective material 58 is formed across the planarized upper surface 57. The protective material protects an upper surface of semiconductor material 12 during subsequent etching of a liner (described below), and during etching of first insulative material 59. Material 58 may comprise any material suitable for providing such protection. Material 58 is a sacrificial material, and accordingly may comprise electrically conductive compositions and/or electrically insulative compositions. In some embodiments, material 58 may comprise one or more of metal, metal-containing compositions, metal-containing oxide, carbon, etc.

Figure 6:
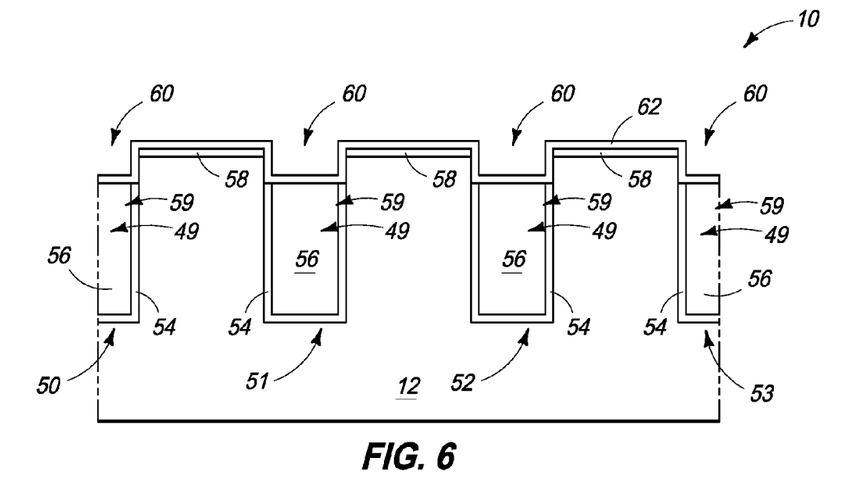

Referring to FIG. 6, material 58 is patterned to form recesses 60 extending therethrough, and an upper portion of the first insulative material 59 is removed to extend such recesses into the cavities 49. The material 58 may be patterned utilizing any suitable methodology, including, for example, utilization of a photolithographically-patterned photoresist mask (not shown), and/or a sublithographic mask (not shown).

Liner material 62 is formed within recesses 60, and in the shown embodiment also extends across an upper surface of protective material 58. The liner material is subsequently utilized to protect a region of semiconductor material 12 during etching of insulative material 59, and during etching of another region of material 12. The liner material may comprise any composition suitable for such purpose. The liner material is a sacrificial material, and accordingly may comprise an insulative composition or a conductive composition. In some embodiments, material 62 may comprise one or more of metal, metal-containing compositions, metal-containing oxide, carbon, etc.

Figure 7:
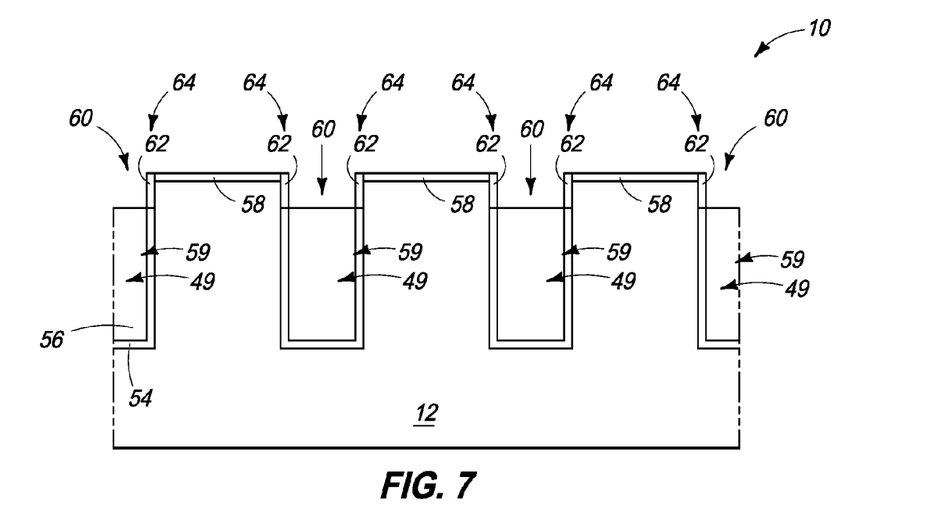

Referring to FIG. 7, material 62 is subjected to an anisotropic etch which patterns material 62 into liners 64 along sidewalls of recesses 60.

Figure 8:
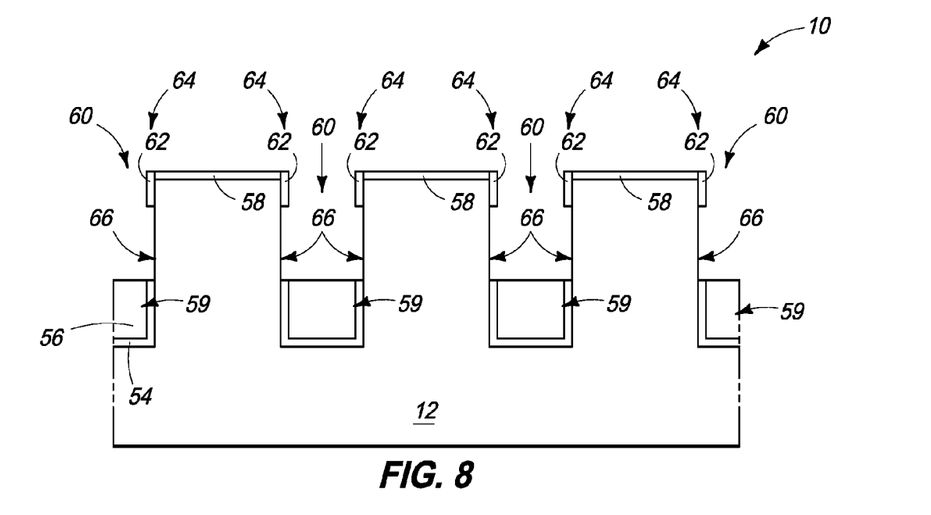

Referring to FIG. 8, an additional portion of first insulative 59 is removed to expose segments 66 of semiconductor material 12. The exposed segments are vertically between the liner material 62 and the first insulative material 59.

Figure 9:
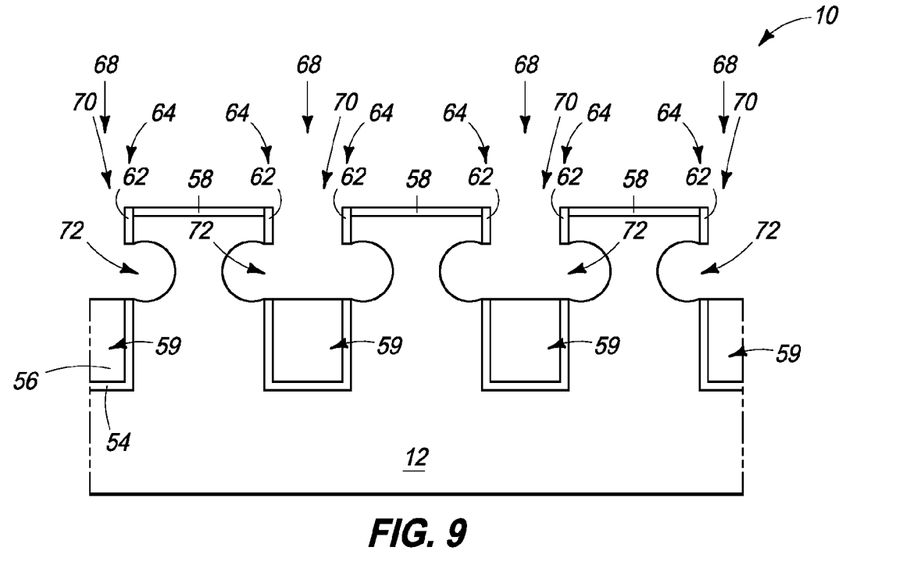

Referring to FIG. 9, semiconductor material 12 is isotropically etched through the exposed segments 66 (FIG. 8). The isotropic etching transforms recesses 60 (FIG. 8) into openings 68 having narrow upper regions 70 and wide, bulbous lower regions 72. The illustrated shape of regions 72 is one of many bulbous shapes that may be formed. Etching conditions may be altered to achieve desired shapes. In some example embodiments, the regions 72 may have sharper corners adjacent materials 62 and 54 than is shown, and/or the regions 72 may have larger radii than is shown.

Figure 10:
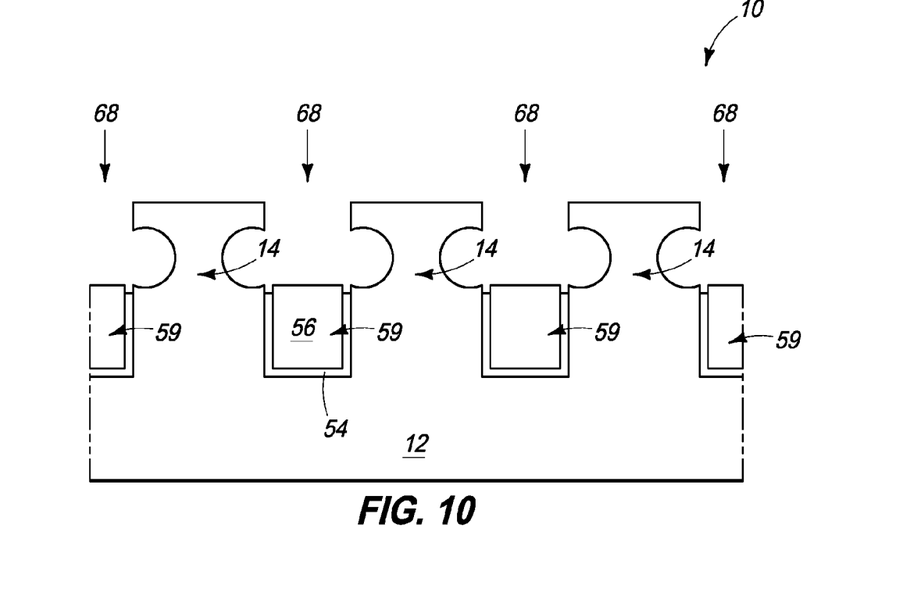

Referring to FIG. 10, liner material 62 (FIG. 9) is removed, as is protective material 58 (FIG. 9). The semiconductor material 12 of FIG. 10 has been patterned into a plurality of pillars 14 analogous to the pillar described above with reference to FIG. 1.

Figure 11:
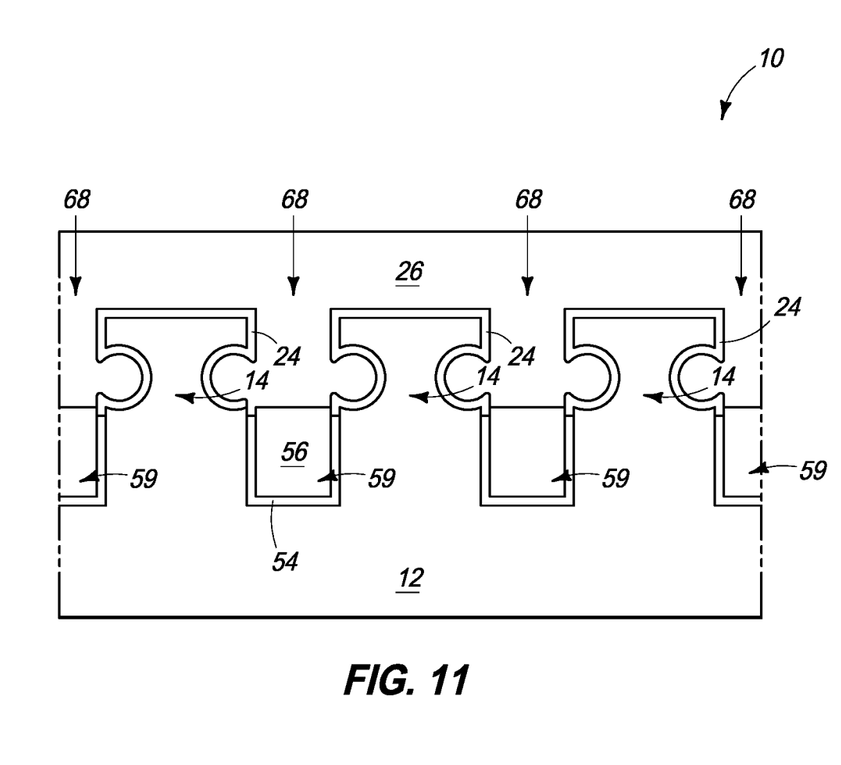

Referring to FIG. 11, gate dielectric material 24 is formed along sidewalls of openings 68, and gate material 26 is formed within the openings and over the gate dielectric material. The gate material extends over regions of semiconductor material 12 between opening 68.

Figure 12:
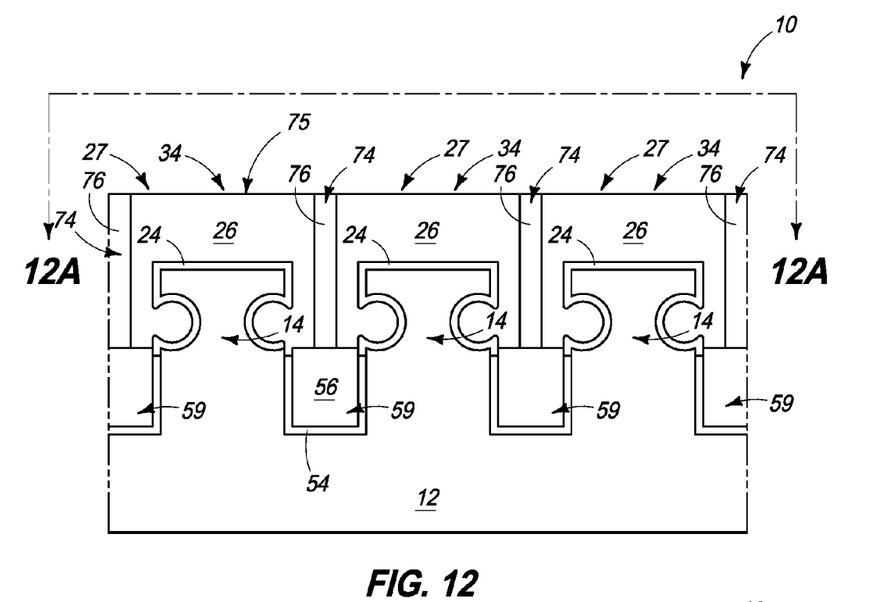

Referring to FIG. 12, openings 74 are formed to extend through the gate material 26 within openings 68 (FIG. 11), and then the openings 74 are filled with second insulative material 76. Such second insulative material may comprise any suitable composition or combination of compositions; and in some embodiments may comprise one or both of silicon dioxide and silicon nitride. In some embodiments, second insulative material 76 may comprise a composition in common with first insulative material 59; and in other embodiments second insulative material 76 may comprise entirely different compositions relative to the first insulative material 59.

The second insulative material splits gate material 26 within each opening 68 (such gate material is shown in FIG. 11) into two portions which are electrically isolated from one another, and which correspond to transistor gates 27. Each of the transistor gates extends from one opening 68 to another (with the openings 68 being shown in FIG. 11), and wraps around a pillar of semiconductor material between the openings.

A planarized surface 75 extends across materials 26 and 76. Such planarized surface may be formed with any suitable processing, and in some embodiments may be formed utilizing CMP.

Figure 12A:
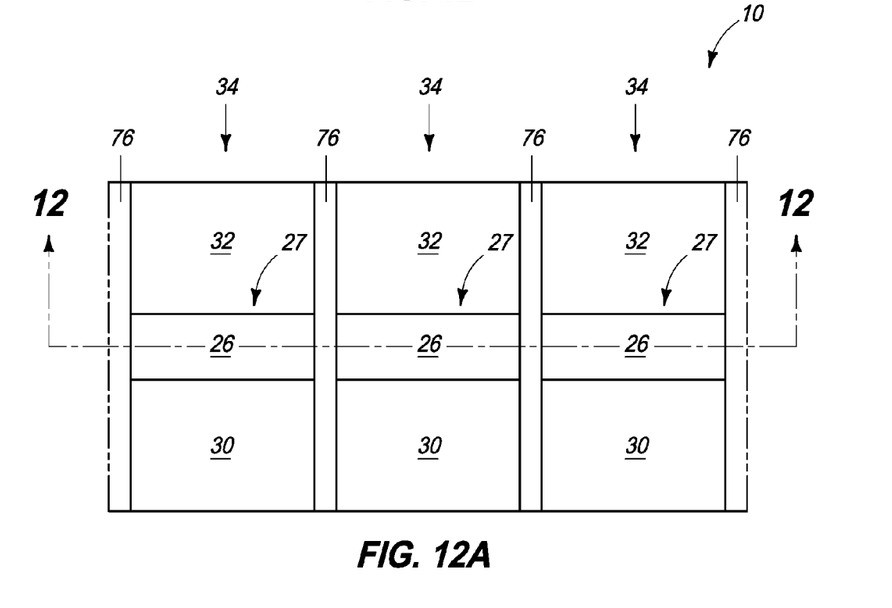
FIG. 12A is a top view of the construction of FIG. 12. The view of FIG. 12 is along the line 12-12 of FIG. 12A, and the view of FIG. 12A is along the line 12A-12A of FIG. 12.

The construction of FIG. 12 comprises a plurality of transistors 34 analogous to the transistor described above with reference to FIG. 1. A top view of FIG. 12 is shown in FIG. 12A to illustrate that source/drain regions 30 and 32 may be formed on opposing sides of gates 27.

Another example processing sequence of forming transistors is described with reference to FIGS. 13-20.

Figure 13:
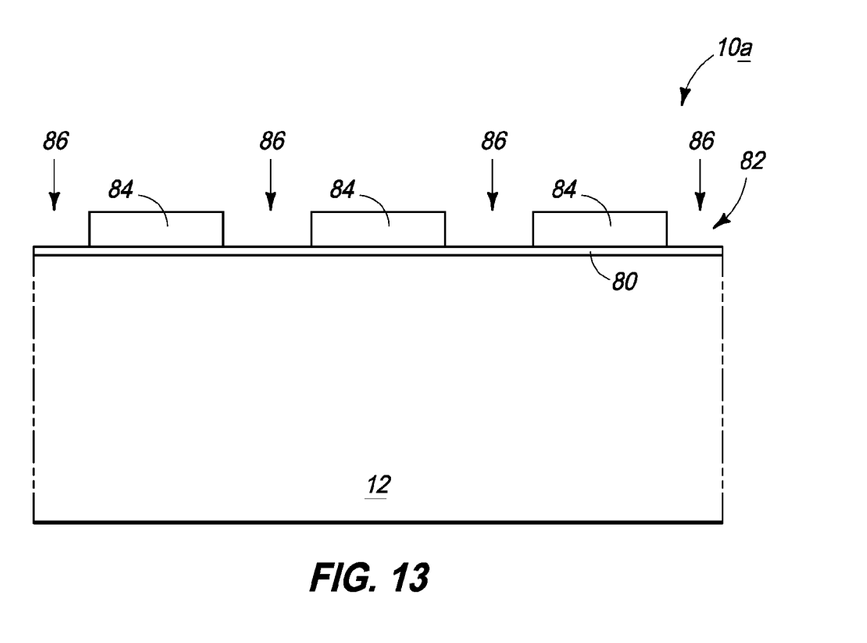
FIGS. 13-20 are diagrammatic cross-sectional views of various process stages of another example embodiment method of forming a plurality of transistors.

FIG. 13 shows a construction 10a comprising semiconductor material 12, comprising a protective material 80 over material 12, and comprising a patterned mask 82 over material 80. The mask 82 comprises masking material 84. The patterned masking material 84 may comprise any suitable composition or combination of compositions; including, for example, photolithographically patterned photoresist and/or sub-lithographically patterned material (such as material patterned utilizing pitch-multiplication methodologies).

Protective material 80 may comprise any suitable composition or combination of compositions; and in some embodiments may comprise silicon nitride and/or silicon dioxide.

Gaps 86 extend through patterned mask 82.

Figure 14:
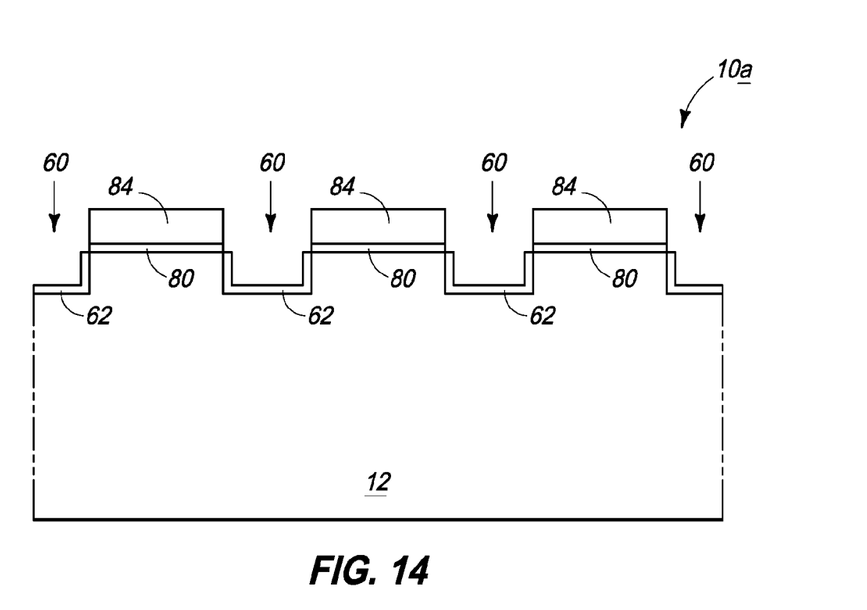

Referring to FIG. 14, gaps 86 (FIG. 13) are extended into semiconductor material 12 to form recesses 60, and liner material 62 is formed within the recesses. The liner material may comprise any suitable composition or combination of compositions; and in some embodiments may comprise silicon nitride and/or silicon dioxide.

Figure 15:
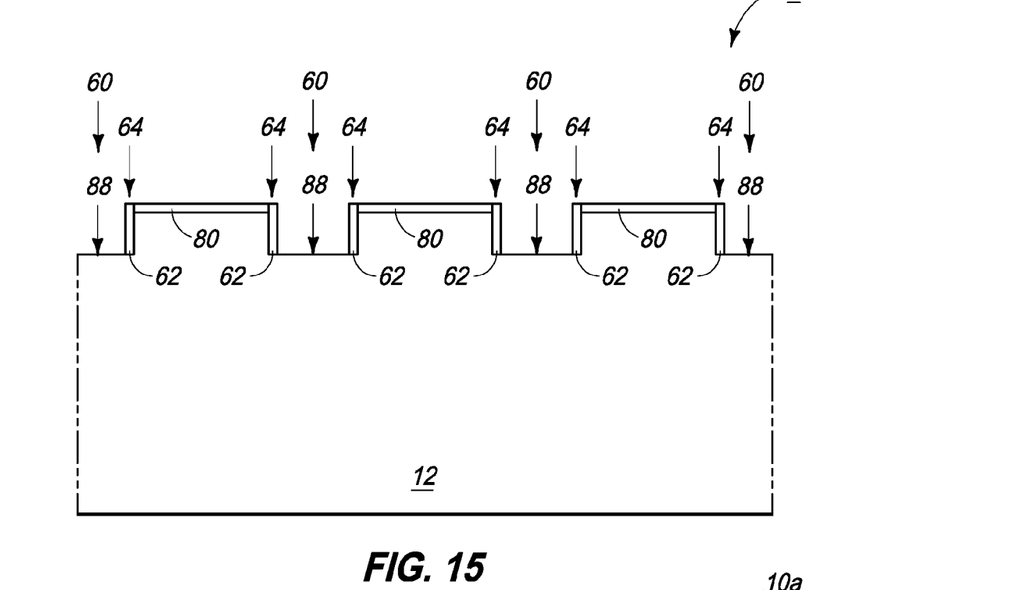

Referring to FIG. 15, material 62 is subjected to an anisotropic etch which patterns material 62 into liners 64 along sidewalls of recesses 60. After material 62 is etched, segments 88 of semiconductor material 12 are exposed along bottoms of recesses 60.

In the shown embodiment, masking material 84 (FIG. 14) is removed prior to, or during, the anisotropic etching of liner material 62.

Figure 16:
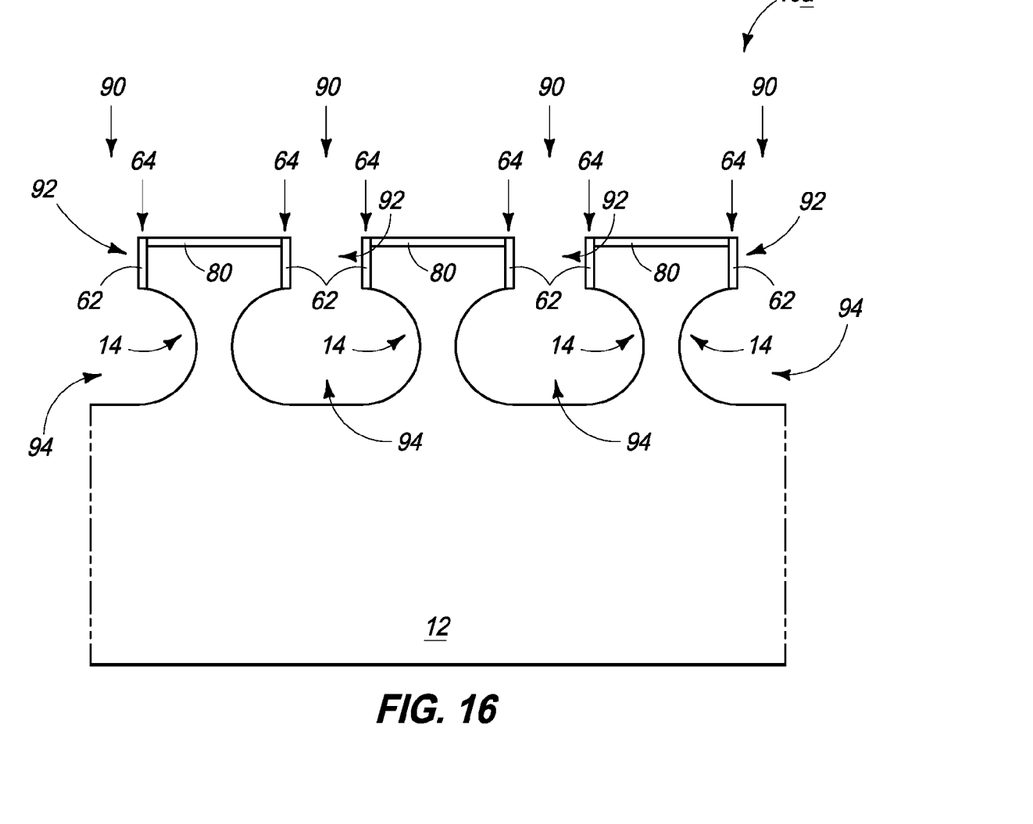

Referring to FIG. 16, semiconductor material 12 is isotropically etched through the exposed segments 88 (FIG. 15). The isotropic etching transforms recesses 60 (FIG. 15) into openings 90 having narrow upper regions 92 and wide, bulbous lower regions 94. The illustrated shape of regions 94 is one of many bulbous shapes that may be formed. Etching conditions may be altered to achieve desired shapes. The semiconductor material 12 of FIG. 16 is patterned into a plurality of pillars 14 analogous to the pillar described above with reference to FIG. 2.

Figure 17:
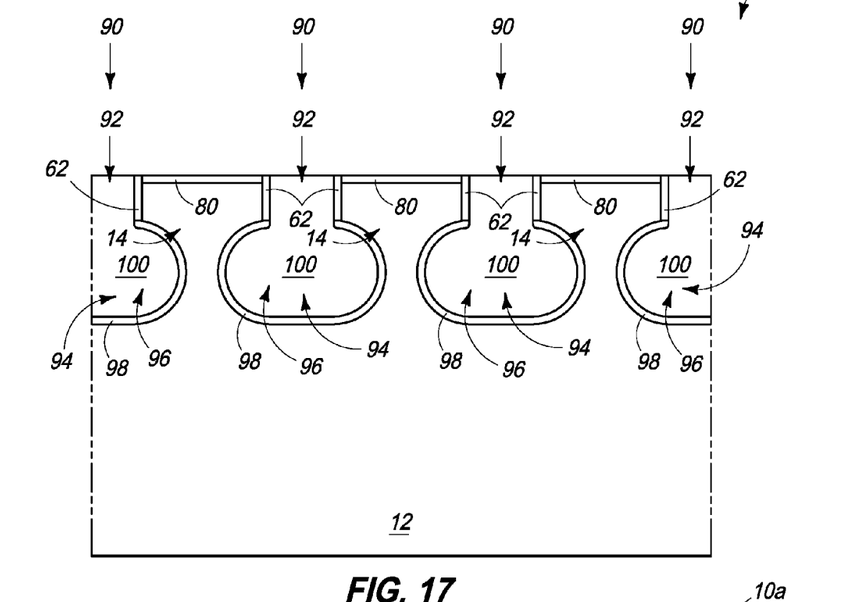

Referring to FIG. 17, insulative compositions 98 and 100 are formed within openings 90. The compositions 98 and 100 may comprise silicon dioxide and silicon nitride, respectively, in some embodiments. The liner material 62 and protective material 80 are shown remaining along semiconductor material 12 at the processing stage of FIG. 17. In other embodiments, one or both of materials 62 and 80 may be removed prior to forming compositions 98 and 100; and in such embodiments material 98 may extend along the narrow upper regions 92 of openings 90, and/or across upper surfaces of pillars 14. The compositions 98 and 100 may be together referred to as a first insulative material 96 in some embodiments.

Figure 18:
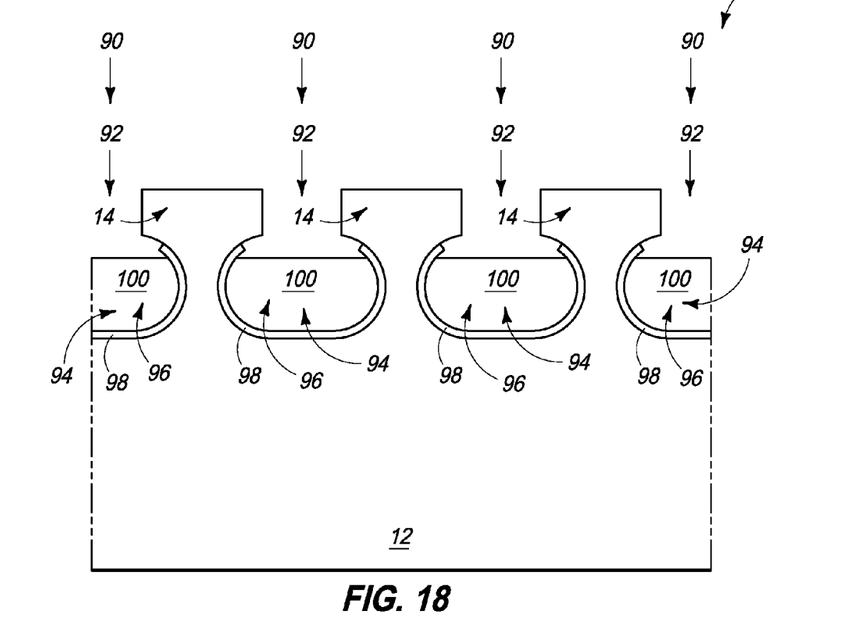

Referring to FIG. 18, liner material 62 (FIG. 17) and protective material 80 (FIG. 17) are removed. The first insulative material 96 is recessed within openings 90 until the wide lower regions 94 of the openings are only partially filled with insulative material 96. In some embodiments, the wide regions may be more than half-filled with insulative material 96 at the processing stage of FIG. 18, and in other embodiments there may be less than half-filled.

In the shown embodiment of FIG. 18, composition 100 is recessed further than composition 98. In other embodiments, compositions 98 and 100 may be recessed to about a same extent as one another, and in yet other embodiments composition 98 may be recessed further than composition 100.

Figure 19:
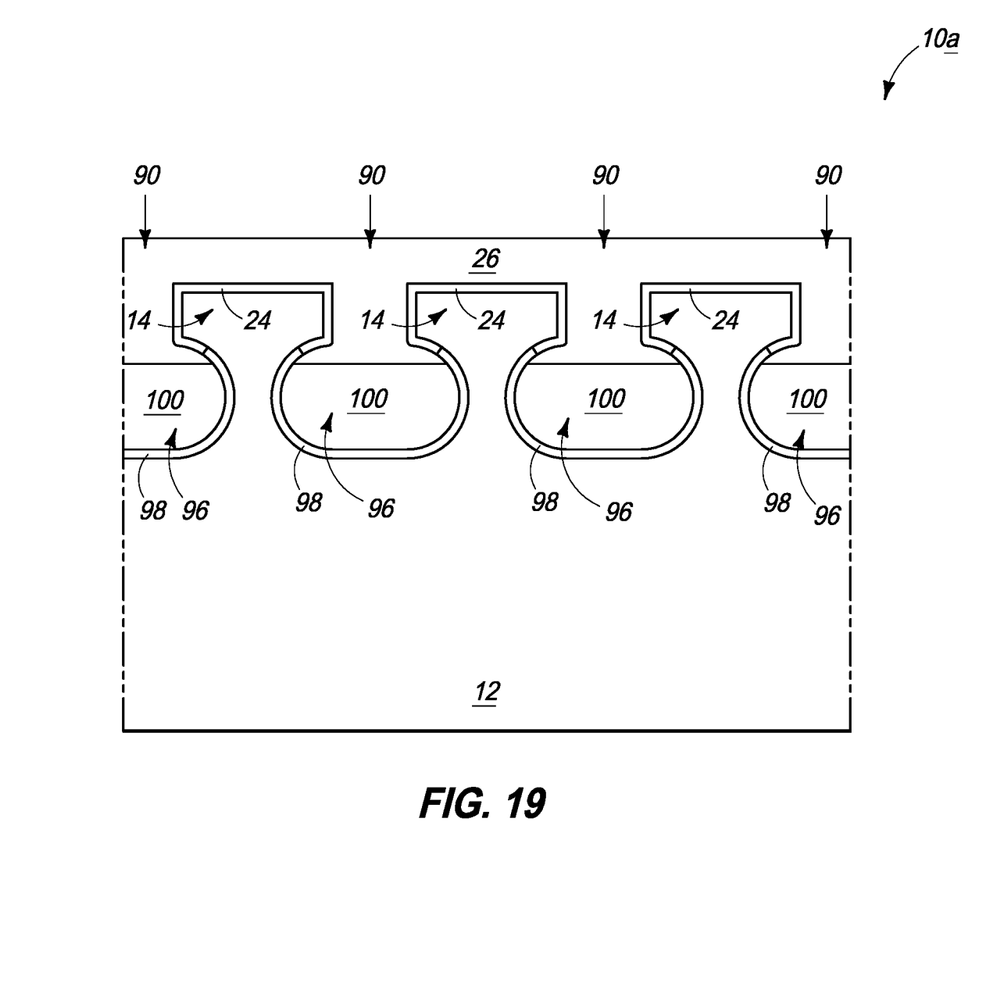

Referring to FIG. 19, gate dielectric material 24 is formed along sidewalls of openings 90, and gate material 26 is formed within the openings and over the gate dielectric material. The gate material 26 and gate dielectric material 24 extend over regions of semiconductor material 12 between openings 90.

Figure 20:
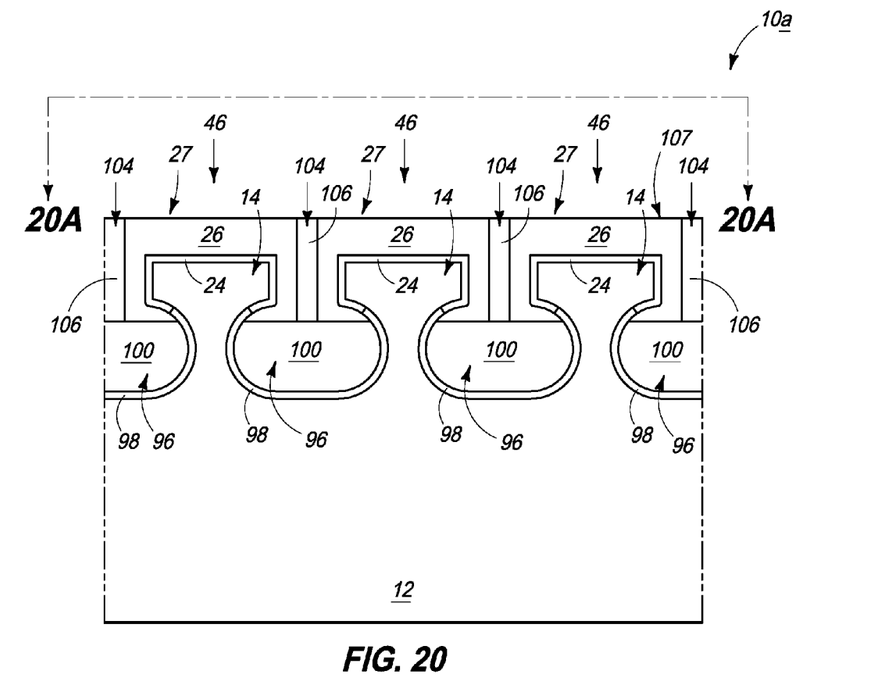

Referring to FIG. 20, openings 104 are formed to extend through the gate material 26 within openings 90 (FIG. 19), and then the openings 104 are filled with second insulative material 106. Such second insulative material may comprise any suitable composition or combination of compositions; and in some embodiments may comprise one or both of silicon dioxide and silicon nitride. In some embodiments, second insulative material 106 may comprise a composition in common with first insulative material 96, and in other embodiments second insulative material 106 may comprise entirely different compositions relative to the first insulative material 96.

The second insulative material 106 splits gate material 26 within each opening 90 (such gate material is shown in FIG. 19) into two portions which are electrically isolated from one another, and which correspond to transistor gates 27. Each of the transistor gates extends from one opening 90 to another (with the openings 90 being shown in FIG. 19), and wraps around a pillar of semiconductor material between the openings.

A planarized surface 107 extends across materials 26 and 106. Such planarized surface may be formed with any suitable processing, and in some embodiments may be formed utilizing CMP.

Figure 20A:
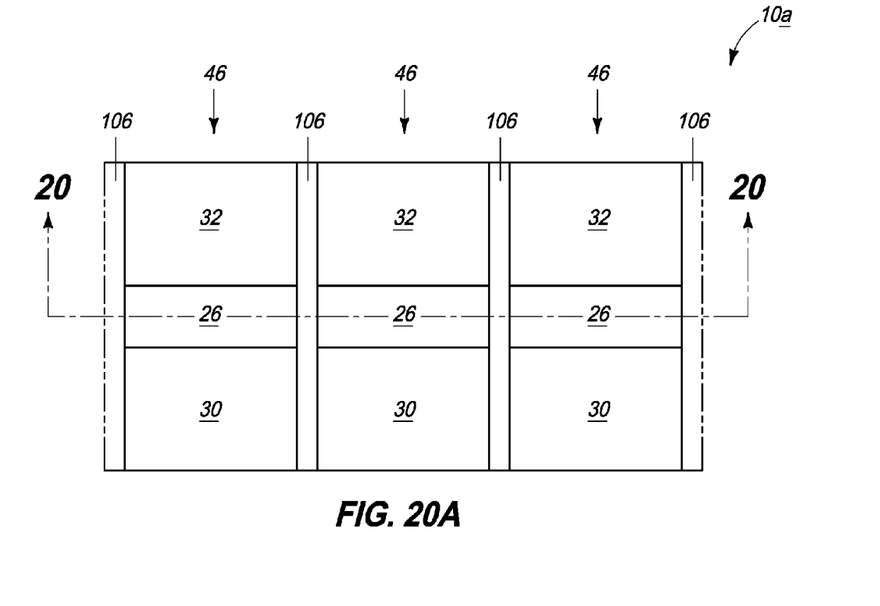
FIG. 20A is a top view of the construction of FIG. 20. The view of FIG. 20 is along the line 20-20 of FIG. 20A, and the view of FIG. 20A is along the line 20A-20A of FIG. 20.

The construction of FIG. 20 comprises a plurality of transistors 46 analogous to the transistor described above with reference to FIG. 2. A top view of FIG. 20 is shown in FIG. 20A to illustrate that source/drain regions 30 and 32 may be formed on opposing sides of gates 27.

The structures and devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a transistor. Spaced-apart recesses are formed to extend into semiconductor material. The recesses have upper regions lined with liner material and have segments of semiconductor material exposed along lower regions. Semiconductor material is isotropically etched through the exposed segments while the upper regions remain protected with the liner material. The isotropic etching transforms the recesses into openings having wide lower regions beneath narrow upper regions. The liner material is removed. Gate dielectric material is formed along sidewalls of the openings. Gate material is formed within the openings and over regions of the semiconductor material between the openings. Insulative material is formed down the center of each opening and entirely through the gate material. The insulative material splits the gate material within each opening into two isolated portions. A segment of gate material extends from one of the openings to the other, and wraps around a pillar of the semiconductor material between the openings. The segment is a gate of a transistor. Source/drain regions are formed on opposing sides of the gate.

Some embodiments include a method of forming a transistor. Spaced-apart recesses are formed to extend into semiconductor material. Sidewalls of the recesses are lined with liner material while leaving bottoms of the recesses exposed. Semiconductor material is isotropically etched through the exposed bottoms of the recesses while the sidewalls remain protected with the liner material. The isotropic etching transforms the recesses into openings having bulbous lower regions beneath narrow upper regions. The liner material is removed. Gate dielectric material is formed along sidewalls of the openings. Gate material is formed within the openings and over regions of the semiconductor material between the openings. Insulative material is formed down the center of each opening and entirely through the gate material. The insulative material splits the gate material within each opening into two isolated portions. A segment of gate material extends from one of the openings to the other, and wraps around a pillar of the semiconductor material between the openings. The segment is a gate of a transistor. Source/drain regions are formed on opposing sides of the gate.

Some embodiments include a method of forming a transistor. Spaced-apart cavities are formed to extend into semiconductor material, and the cavities are filled with first insulative material. Some the first insulative material is removed from the cavities to leave recesses extending into the cavities. Liner material is formed along sidewalls of the recesses. After the liner material is formed, some of the first insulative material is removed to leave exposed segments of semiconductor material between the liner material and the first insulative material. Semiconductor material is isotropically etched through the exposed segments while the sidewalls remain protected with the liner material. The isotropic etching transforms the recesses into openings having bulbous lower regions beneath narrow upper regions. The liner material is removed. Gate dielectric material is formed along sidewalls of the openings. Gate material is formed within the openings and over regions of the semiconductor material between the openings. Second insulative material is formed down the center of each opening and entirely through the gate material. The second insulative material splits the gate material within each opening into two isolated portions. A segment of gate material extends from one of the openings to the other, and wraps around a pillar of the semiconductor material between the openings. The segment is a gate of a transistor. Source/drain regions are formed on opposing sides of the gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A device comprising:
   first and second pillars of semiconductor material, each of the first and second pillars of semiconductor material comprising a wide upper region and a narrow lower region under the wide upper region;
   a first gate dielectric material formed along sidewalls of the wide upper region and the narrow lower region of the first pillar of semiconductor material;
   a second gate dielectric material formed along sidewalls of the wide upper region and the narrow lower region of the second pillar of semiconductor material;
   a first gate electrode wrapping around the wide upper region and the narrow lower region of the first pillar of semiconductor material with intervening first gate dielectric material;
   a second gate electrode wrapping around the wide upper region and the narrow lower region of the second pillar of semiconductor material with intervening second gate dielectric material;
   an insulative material between the first and second gate electrodes to isolate the first and second gate electrodes from each other;
   first source and drain regions within the first pillar of semiconductor material; and
   second source and drain regions within the second pillar of semiconductor material.

2. The device of claim 1, wherein each of the first and second pillars of semiconductor material has a bulbous cavity extending into the narrow lower region.

3. The device of claim 1, wherein each of the first and second pillars of semiconductor material further comprises a base region, the narrow lower region being between the upper wide region and the base region.

4. The device of claim 3, wherein the base regions are substantially the same in width as the upper wide regions.

5. The device of claim 3, wherein the base regions are larger in width than the upper wide regions.

6. The device of claim 3, wherein the insulative material comprises a first portion between the first and second gate electrodes and a second portion between the base region of the first pillar of semiconductor material and the base region of the second pillar of semiconductor material.

7. The device of claim 6, wherein the second portion of the insulative material is larger in width than the first portion of the insulative material.

8. A device comprising:
   first, second and third openings extending into semiconductor material apart from each other to define a first pillar of semiconductor material between the first and second openings and a second pillar of semiconductor material between the second and third openings, each of the first, second and third openings including a wide lower region and a narrow upper region so that each of the first and second pillars includes a narrow lower portion and a wide upper portion;
   a first gate dielectric material formed along sidewalls of the wide upper portion and the narrow lower portion of the first pillar;
   a second gate dielectric material formed along sidewalls of the wide upper portion and the narrow lower portion of the second pillar;
   a first gate electrode wrapping around the wide upper portion and the narrow lower portion of the first pillar with intervening first gate dielectric material;
   a second gate electrode wrapping around the wide upper portion and the narrow lower portion of the second pillar with intervening second gate dielectric material;
   an insulative material in the second opening between the first and second gate electrodes to isolate the first and second gate electrodes from each other;
   first source and drain regions within the first pillar; and
   second source and drain regions within the second pillar.

9. The device of claim 8, wherein the wide lower region of at least the second opening is bulbous so that the narrow portions of the first and second pillars are merged with each other through an intermediate portion of semiconductor material, the intermediate portion having a bulbous surface.

10. The device of claim 9, wherein the insulative material is elongated to contact with the intermediate portion.

11. The device of claim 8, wherein at least the second opening includes a base region extending into the semiconductor material from the wide lower region the second opening.

12. The device of claim 11, wherein the base region of the second opening is substantially the same in width as the narrow upper region of the second opening.

13. The device of claim 12, wherein the insulative material fills the base region of the second opening.

14. A device comprising:
   a first transistor comprising:
      a first semiconductor pillar;
      first source and drain regions formed in the first semiconductor pillar to define a first channel region therebetween, the first channel region including a first wide upper portion and a first narrow lower portion;
      a first gate dielectric material formed along sidewalls of the first wide upper region and the first narrow lower region of the first channel region; and
      a first gate electrode wrapping around the first wide upper region and the first narrow lower region of the first channel region with intervening first gate dielectric material;
   a second transistor comprising:
      a second semiconductor pillar;
      second source and drain regions within the second semiconductor pillar to define a second channel region therebetween, the second channel region including a second wide upper portion and a second narrow lower portion;
      a second gate dielectric material formed along sidewalls of the second wide upper region and the second narrow lower region of the second channel region; and
      a second gate electrode wrapping around the second wide upper region and the second narrow lower region of the second channel region with intervening second gate dielectric material; and
   an insulative material between the first and second transistors to isolate the first and second gate electrodes from each other.

15. The device of claim 14, wherein each of the first and second channel regions is approximately bulbous.

16. The device of claim 14, wherein the first source and drain regions of the first transistor are within end portions of the first semiconductor pillar, and wherein the second source and drain regions of the second transistor are within end portions of the second semiconductor pillar.

* * * * *